(12) United States Patent
Yamada (10) Patent No.: US 7,106,116 B2
(45) Date of Patent: Sep. 12, 2006

(54) PULSE DUTY DETERIORATION DETECTION CIRCUIT

(75) Inventor: Toshimi Yamada, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 346 days.

(21) Appl. No.: 10/689,028

(22) Filed: Oct. 21, 2003

(65) Prior Publication Data

US 2005/0001488 A1    Jan. 6, 2005

(30) Foreign Application Priority Data

Jun. 19, 2003    (JP) .............................. 2003-175177

(51) Int. Cl.
    *H03K 5/06*    (2006.01)
(52) U.S. Cl. .................. 327/175; 327/185; 327/20; 327/24; 327/25; 327/26; 307/106
(58) Field of Classification Search ................ 307/106; 327/175, 185, 20, 24, 25, 26
    See application file for complete search history.

(56) References Cited

U.S. PATENT DOCUMENTS 4,399,412 A * 8/1983 Rinaldi .......................... 327/38
5,422,918 A * 6/1995 Vartti et al. .................. 375/371
5,663,665 A * 9/1997 Wang et al. .................... 327/3
5,923,191 A * 7/1999 Nemetz et al. ................ 327/20
6,087,868 A * 7/2000 Millar ......................... 327/156

FOREIGN PATENT DOCUMENTS

JP          04-294632        10/1992
JP       2002026704 A   *    1/2002

* cited by examiner

*Primary Examiner*—Brian Sircus
*Assistant Examiner*—Dru Parries
(74) *Attorney, Agent, or Firm*—VolentineFrancos&Whitt PLLC

(57) ABSTRACT

A pulse duty deterioration detection circuit with a high monitoring precision is easily provided. The pulse duty deterioration detection circuit comprises a delay circuit comprised of a general-purpose gate circuit which generates a delayed synchronous to-be-monitored clock by delaying the to-be-monitored clock by a predetermined time, a latch circuit which detects based on the to-be-monitored clock and the delayed synchronous to-be-monitored clock that a value of a decrease in a pulse width to be determined by a pulse duty of the to-be-monitored clock becomes smaller than the predetermined time, and a flip-flop circuit which samples an output signal of the latch circuit based on the to-be-monitored clock.

4 Claims, 9 Drawing Sheets

PULSE DUTY DETERIORATION DETECTION CIRCUIT

BACKGROUND OF THE INVENTION

1. Field of the Invention

The present invention relates to a pulse duty deterioration detection circuit for a pulse signal.

2. Description of the Related Art

Some of existing communication devices or the like are so designed as to operate based on an externally received clock as a reference. The clock receiving section of such a device receives a clock from outside, generates clocks of various frequencies based on that clock and distributes the clocks to the individual sections in the device. Therefore, the clock receiving section of the device has a duty monitoring capability which generates an alarm when an abnormality occurs in any of the clocks, and performs a process, such as inhibition of sending the abnormal clock to the associated section.

Figure 1:
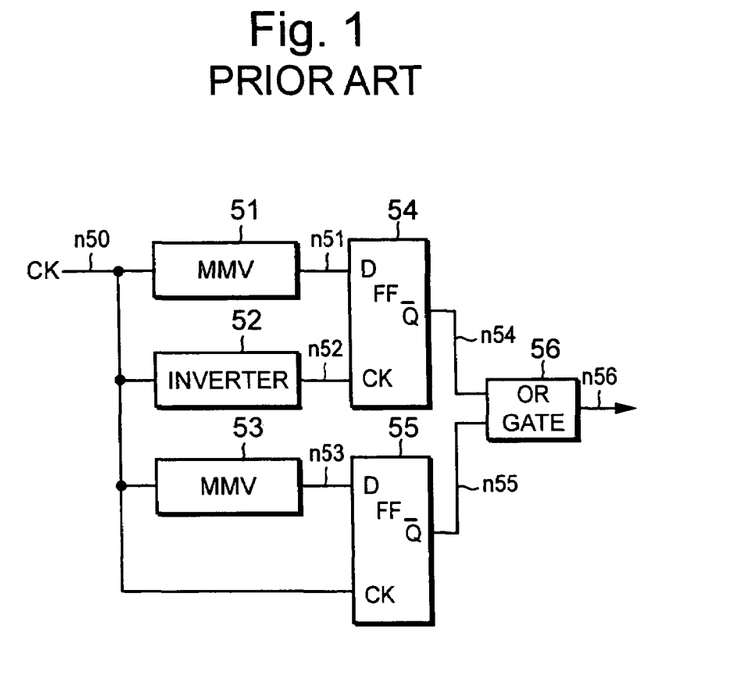
FIG. 1 is a circuit diagram of a conventional pulse duty deterioration detection circuit.

FIG. 1 shows a conventional circuit of this type which is disclosed in, for example, Japanese Patent Laid-Open No. 294632/1992. The circuit comprises an inverter 52 which inverts a to-be-monitored clock n50, a monostable multivibrator (hereinafter referred to as "MMV") 51 which generates a reference pulse n51 synchronous with the rising of the to-be-monitored clock n50, an MMV 53 which generates a reference pulse n53 synchronous with the falling of the to-be-monitored clock n50, an FF (Flip-Flop) 54 which samples the reference pulse n51 at the rising of the output, n52, of the inverter 52, an FF 55 which samples the reference pulse n53 at the rising of the to-be-monitored clock n50 and an OR gate 56 which outputs the logical sum of an inverted output n54 of the FF 54 and inverted output n55 of the FF 55 as a duty monitor result n56.

With the structure, the to-be-monitored clock n50 is a trigger input to each of the MMVs 51 and 53, and the MMV 51 is triggered by the rising of the to-be-monitored clock n50 while the MMV 53 is triggered by the falling of the to-be-monitored clock n50. The output pulses n51 and n53 of the MMVs 51 and 53 are latched by the FFs 54 and 55, respectively. The latch timing of the FF 54 is the timing of the falling of the to-be-monitored clock n50 and the latch timing of the FF 55 is the timing of the rising of the to-be-monitored clock n50.

The inverted output n54 of the FF 54 and the inverted output n55 of the FF 55 are input to the OR gate 56 whose output n56 is the duty monitor result n56. The time constant, t, of the MMVs 51 and 53 is preset so as to be t=A×T where A is a reference duty ratio and T is the period of the to-be-monitored clock. Therefore, the output pulses n51 and n53 of the MMVs 51 and 53 are reference pulses which are respectively synchronous with the rising and falling of the to-be-monitored clock n50 and have the reference duty ratio. By sampling the levels of both output pulses at the rising and falling timings of the to-be-monitored clock n50 using the FFs 54 and 55, therefore, the inverted outputs n54 and n55 of the FFs 54 and 55 can have levels according to a change in the reference duty ratio of the to-be-monitored clock n50.

Figure 2:
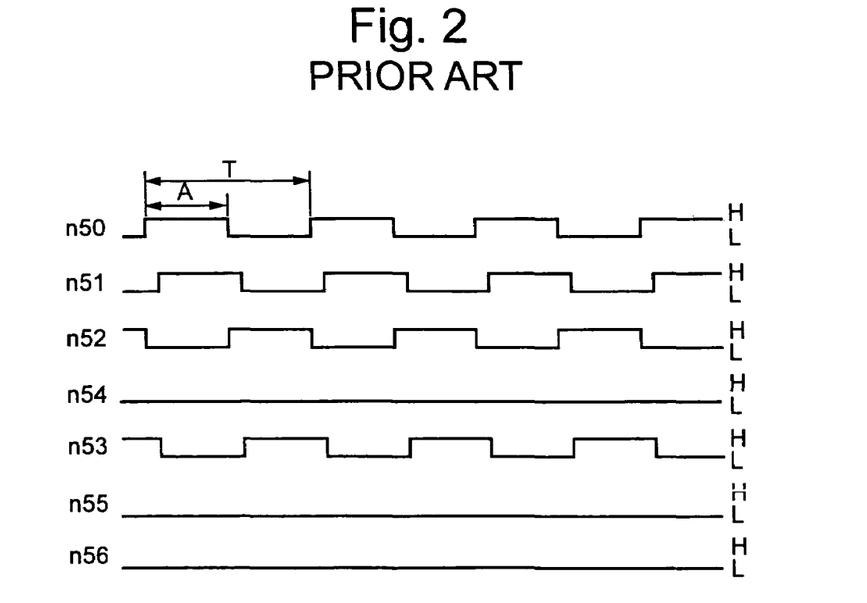
FIG. 2 is a time chart illustrating the operation of the circuit in FIG. 1.
Figure 3:
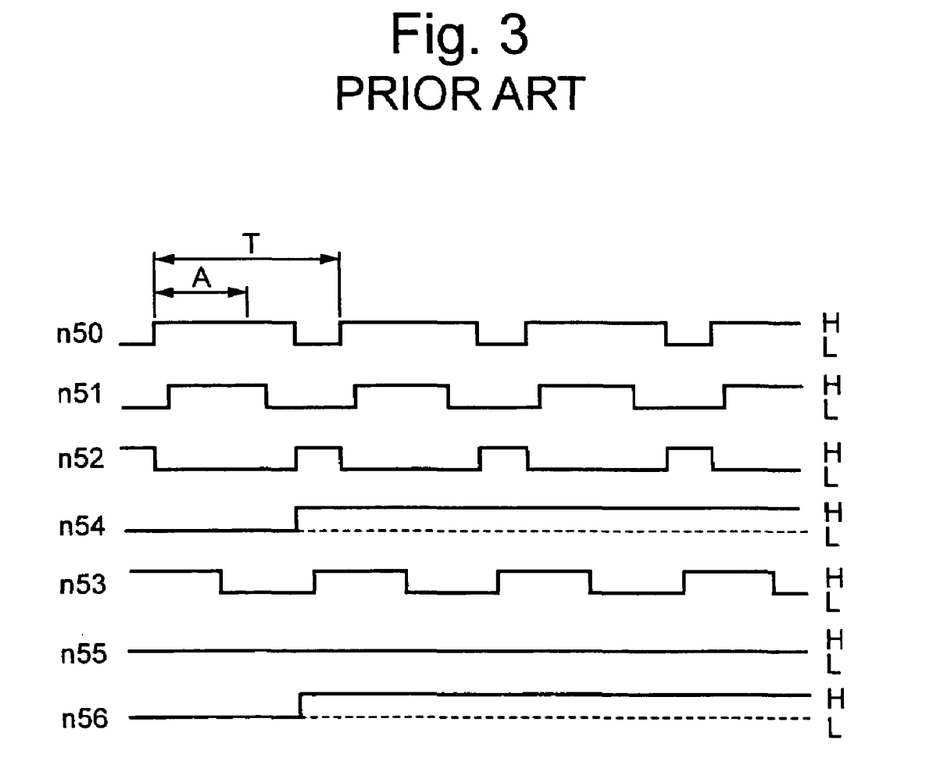
FIG. 3 is a time chart illustrating the operation of the circuit in FIG. 1.

FIGS. 2 and 3 are time charts illustrating the operation of the circuit in FIG. 1, and FIG. 2 shows waveforms in case where the duty ratio of the to-be-monitored clock n50 is normal. In this case, the inverted outputs n54 and n55 of the FFs 54 and 55 both become "Low" levels and the output n56 of the OR gate 56 shows a "Low" level (normal). FIG. 3 shows waveforms in case where the duty ratio of the to-be-monitored clock n50 is greater than the reference duty ratio A. In this case, the inverted output n54 of the FF 54 is changed to a "High" level and the output n56 of the OR gate 56 shows a "High" level (abnormal).

The above-described prior art uses MMVs to monitor a variation in the phase of the edge portion of the to-be-monitored clock. The width of the output pulse can be changed by changing the value of a resistor to be added and the value of a capacitor.

Normally, the resistor and capacitor to be added are attached to the outside in consideration of an element error and the minimum values of the resistance of the resistor to be added and the capacitance which can guarantee the operation are about 1 kΩ and 60 pF, respectively. Therefore, the minimum pulse width set has an accuracy of about 60 ns, which is the set accuracy for the allowance range for the variation in the phase of the edge portion of the to-be-monitored clock. Apparently, the prior art has a shortcoming that the monitoring precision is deteriorated or monitoring cannot be performed at a frequency of over ten plus some MHz.

Further, the pulse width of an MMV has such a property as to have a great dependency on the supply voltage. The minimum value of the pulse width normally takes a value when supply voltage is about 5 V. Because the pulse width is inversely proportional to the supply voltage, however, the pulse width would be 100 ns or so when the supply voltage of the power supply of a low voltage as used in the recent portable telephones or the like becomes close to 3 V. This increases an error in the pulse width set, thus lowering the monitoring precision.

SUMMARY OF THE INVENTION

The present invention easily provides a pulse duty deterioration detection circuit with a higher monitoring precision. The first aspect of the invention provides a pulse duty deterioration detection circuit that comprises a delay circuit comprised of a general-purpose gate circuit which generates a delayed synchronous to-be-monitored clock by delaying the to-be-monitored clock by a predetermined time; a latch circuit which detects based on the to-be-monitored clock and the delayed synchronous to-be-monitored clock that a value of a decrease in a pulse width to be determined by a pulse duty of the to-be-monitored clock becomes smaller than the predetermined time; and a flip-flop circuit which samples an output signal of the latch circuit based on the to-be-monitored clock.

The second aspect of the invention provides a pulse duty deterioration detection circuit that comprises a delay circuit comprised of a general-purpose gate circuit which generates a delayed synchronous to-be-monitored clock by delaying the to-be-monitored clock by a predetermined time; a first latch circuit which detects based on the to-be-monitored clock and the delayed synchronous to-be-monitored clock that a value of a decrease in a pulse width to be determined by a pulse duty of the to-be-monitored clock becomes smaller than the predetermined time; a second latch circuit which detects based on the to-be-monitored clock and the delayed synchronous to-be-monitored clock that a value of an increase in the pulse width to be determined by the pulse duty of the to-be-monitored clock becomes greater than the predetermined time; a first flip-flop circuit which samples an output signal of the first latch circuit based on the to-be-monitored clock; a second flip-flop circuit which samples an output signal of the second latch circuit based on the to-be-monitored clock; and a circuit which detects based on output signals of the first and second flip-flop circuits that the pulse width of the to-be-monitored clock lies within a predetermined duty range.

According to the third aspect of the invention, the pulse duty deterioration detection circuit according to the second aspect further comprises a first detection circuit, provided on an output side of the first flip-flop circuit, for outputting a significance signal when it is detected that the pulse duty consecutively drops plural times in a direction of reducing the pulse duty; a second detection circuit, provided on an output side of the second flip-flop circuit, for outputting a significance signal when it is detected that the pulse duty consecutively drops plural times in a direction of increasing the pulse duty; and an output circuit which outputs a signal indicating that the pulse width of the to-be-monitored clock is in a normal range when both of the first and second detection circuits output the significance signals.

According to the fourth aspect of the invention, in the pulse duty deterioration detection circuit according to the third aspect, the delay circuit has a delay element comprised of a plurality of general-purpose gate circuits connected in series and a switch circuit for selecting a delay time of the delay element, and the pulse duty deterioration detection circuit further comprises a counter which counts up when the output circuit outputs a signal indicative of duty deterioration; and a decoder circuit which decodes a count value of the counter, whereby a delay time of the to-be-monitored clock is automatically changed by controlling the switch circuit for selecting the delay time of the delay element in accordance with an output signal of the decoder circuit.

DETAILED DESCRIPTION OF THE INVENTION

Preferred embodiments of the invention suitable for a pulse duty deterioration detection circuit according to the invention will be described below in detail. To avoid the redundant description, like or same reference numerals are given to those components which have substantially the same functions through the specification and the drawings.

First Embodiment

Figure 4:
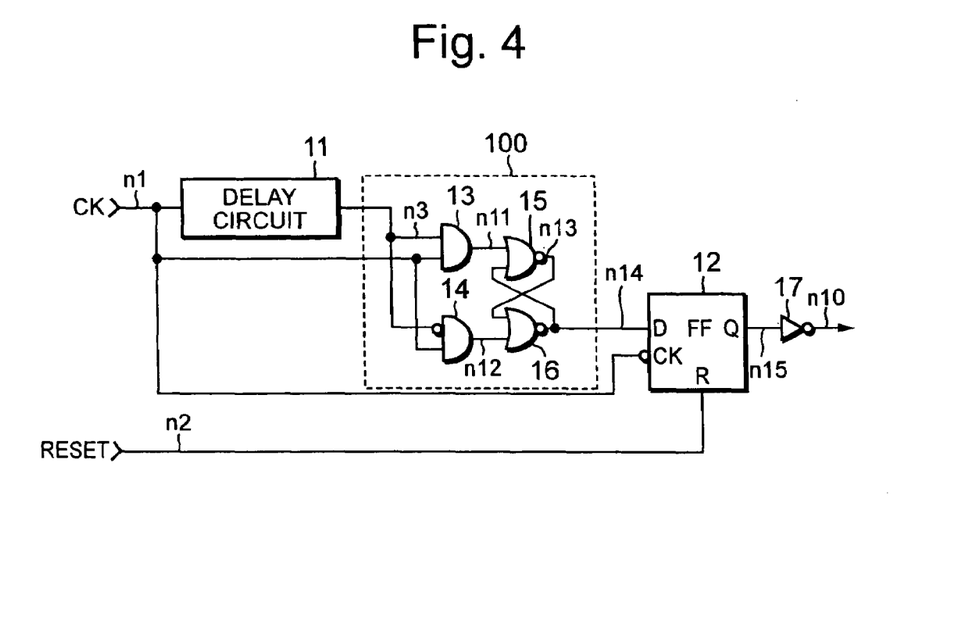
FIG. 4 is a circuit diagram of a pulse duty deterioration detection circuit according to a first embodiment of the invention.

FIG. 4 is a circuit diagram of a pulse duty deterioration detection circuit according to the first embodiment of the invention. The circuit in FIG. 4 comprises a delay circuit section 11 which generates a signal n3 delayed-synchronous with a clock n1 to be monitored (hereinafter called "monitor target clock"), a latch circuit 100 which receives the delayed synchronous signal n3 and the monitor target clock n1, a flip-flop (FF) 12 which receives the inverted signal of the monitor target clock n1 and a reset signal n2, and an inverter 17 which receives the output, n15, of the FF 12.

The delay circuit section 11 is a circuit which gives a predetermined delay value to the monitor target clock n1 to yield a delayed synchronous signal n3, and is comprised of general-purpose gates.

The latch circuit 100 comprises an AND gate 13 which receives the monitor target clock n1 and the delayed synchronous signal n3, and an AND gate 14 which receives the monitor target clock n1 and the inverted signal of the delayed synchronous signal n3, and a NOR latch circuit which is comprised of NOR gates 15 and 16, receives the output signal, n11, of the AND gate 13 and the output signal, n12, of the AND gate 14 and outputs an output signal n14.

The FF 12 latches the output signal n14 of the latch circuit 100 at the timing of the falling of the monitor target clock n1, and outputs a signal n15.

The delay circuit 11 delays the monitor target clock n1 by the time needed to monitor the duty and generates the delayed synchronous signal n3.

The output n14 of the latch circuit 100 latches a phase difference between the monitor target clock n1 and the delayed synchronous signal n3.

When the duty ratio is normal (see a time chart in FIG. 5), the AND gate 13 and the AND gate 14 output phase difference signals n11 and n12 between the monitor target clock n1 and the delayed synchronous signal n3. The phase difference signals n11 and n12 are connected to the NOR latch circuit which is comprised of the NOR gates 15 and 16 and outputs the output signal n14 according to the phase difference signals.

The FF 12 latches the output signal n14 of the latch circuit 100 at the tall timing of the monitor target clock n1 and outputs the signal n15. When the pulse width of the clock signal n1 becomes smaller than the duty monitor time (which is determined by the delay time) at this time, for example, the output n11 of the AND gate 13 stops outputting the phase difference (or becomes a "Low" level), and the AND gate 14 outputs the phase difference n12 (this pulse resets the output n14 of the NOR latch circuit to a "Low" level). Therefore, the output n14 of the latch circuit 100 maintains the "Low" level, the output n15 of the FF 12 becomes the "Low" level, and the output n10 of the inverter 17 becomes the "High" level.

Figure 5:
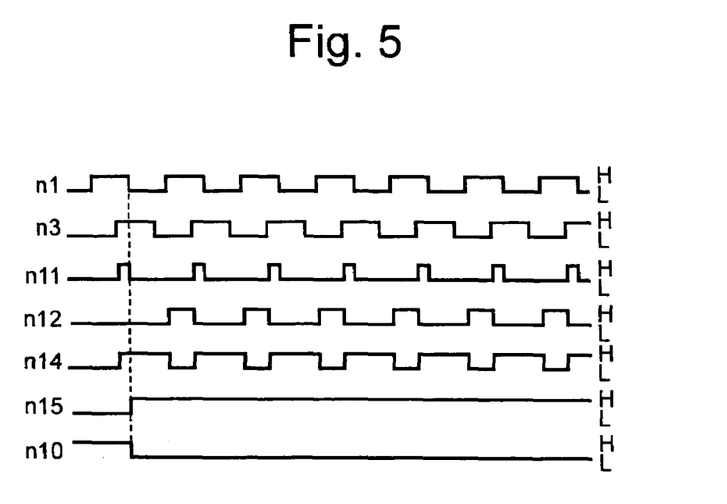
FIG. 5 is a time chart illustrating the operation of the circuit in FIG. 4 when the duty ratio is normal.
Figure 6:
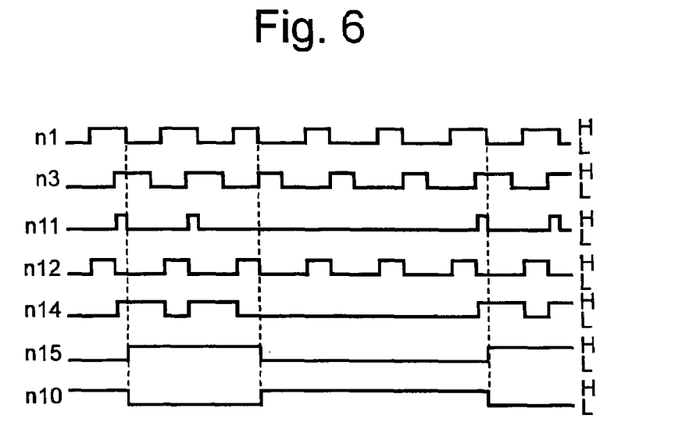
FIG. 6 is a time chart illustrating the operation of the circuit in FIG. 4 when the duty ratio becomes low.

In this embodiment, as apparent from the above, if the monitor result n10 for the duty ratio is a "Low" level, the duty ratio is "normal", whereas if the monitor result n10 is a "High" level, the duty ratio becomes "lower". FIGS. 5 and 6 time charts illustrating the operation of the circuit in FIG. 4. FIG. 5 shows a case where the duty ratio is normal, and FIG. 6 shows a case where the duty ratio becomes lower.

When the reset signal n2 has a "High" level, the output n15 of the FF 12 is reset to a "Low" level asynchronously and the monitor result n10 for the duty ratio becomes a "High" level to be initialized.

As described above, the circuit example detects the deterioration of the pulse duty by monitoring if the clock to be monitored lies within the allowable variation range that is determined based on the delay time of the delay circuit constructed by using general-purpose gates. The circuit example in the embodiment is similar to the conventional circuit using MMVs in that the range of the variation of the clock's edge is monitored. Because the circuit example uses a delay achieved by the general-purpose gate circuits in setting the variation range, however, the delay time can be set to the order of several nanoseconds. The circuit example therefore can detect the deterioration of the pulse duty more accurately than the conventional circuit using MMVs.

The embodiment, as described above, can realize a pulse duty deterioration detection circuit with a high monitoring precision with respect to a monitor target clock by generating a signal delayed-synchronous with the monitor target clock and latching a signal according to the phase difference between the delayed synchronous signal and the monitor target clock n1 by means of the NOR latch circuit. Further, the circuit of the embodiment does not have elements which have a high temperature dependency and has a smaller dependency on the supply voltage, thus reducing a variation in monitoring precision. The embodiment therefore has a higher monitoring precision than the conventional circuit.

Second Embodiment

Figure 7:
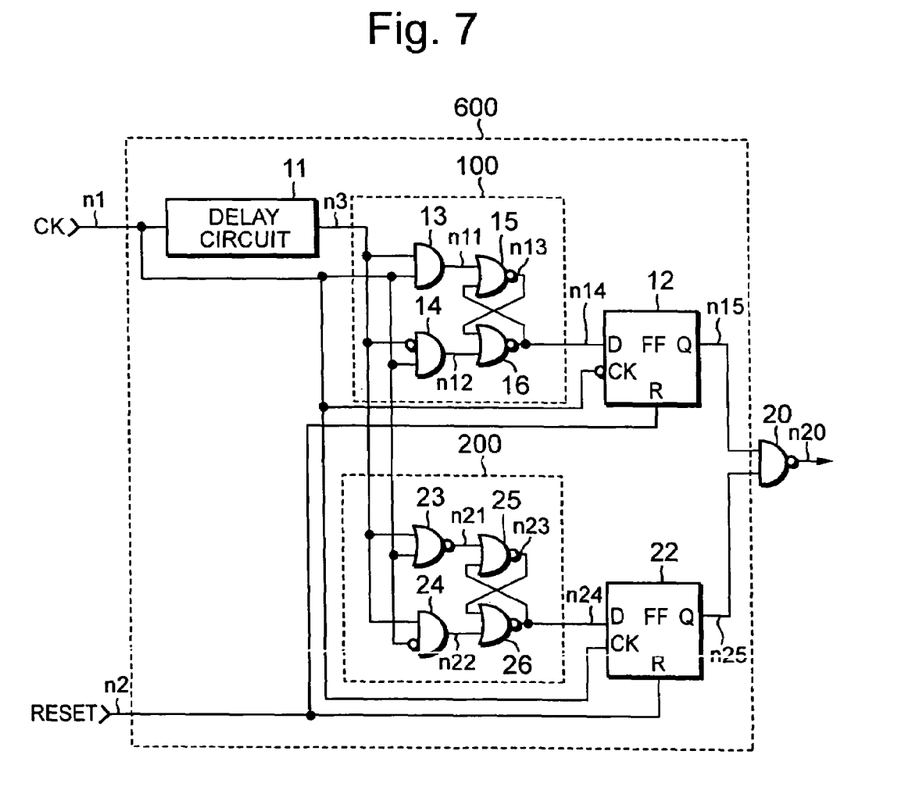
FIG. 7 is a circuit diagram of a pulse duty deterioration detection circuit according to a second embodiment of the invention.

FIG. 7 is a circuit diagram of a pulse duty deterioration detection circuit according to the second embodiment of the invention. The circuit in FIG. 7 comprises a delay circuit section 11 which generates a signal n3 delayed-synchronous with a clock n1 to be monitored, a first circuit (first signal monitoring means) comprised of a latch circuit 100 which receives the delayed synchronous signal n3 and the monitor target clock n1 and a first FF 12 which receives an output signal n14 generated from the latch circuit 100, the inverted signal of the monitor target clock n1 and a reset signal n2, a second circuit (second signal monitoring means) comprised of a latch circuit 200 which receives the delayed synchronous signal n3 and the monitor target clock n1 and a second FF 22 which receives an output signal n24 generated from the latch circuit 200, the inverted signal of the monitor target clock n1 and the reset signal n2, and a NAND gate 20 which receives the output, n15, of the first FF 12 and the output, n25, of the second FF 22.

The latch circuit 200 comprises a NOR gate 23 which receives the monitor target clock n1 and the delayed synchronous signal n3, and an AND gate 24 which receives the inverted signal of the monitor target clock n1 and the delayed synchronous signal n3, and a NOR latch circuit which is comprised of NOR gates 25 and 26, receives the output signal, n21, of the NOR gate 23 and the output signal, n22, of the AND gate 24 and outputs an output signal n24.

The second FF 22 latches the output signal n24 of the latch circuit 200 at the rise timing of the monitor target clock n1, and outputs a signal n25.

The NAND gate 20 takes the inversion of the logical product the output signal n15 of the first FF 12 and the output signal n25 of the second FF 22 and outputs a monitor result n20 for the duty ratio. The reset signal n2 is input to an asynchronous reset terminal of the second FF 22.

The delay circuit 11 generates the delayed synchronous signal n3 which is the monitor target clock n1 delayed by the time needed to monitor the duty.

The output n14 of the latch circuit 100 latches a phase difference between the monitor target clock n1 and the delayed synchronous signal n3.

When the duty ratio is normal, the AND gate 13 and the AND gate 14 output phase difference signals ni1 and n12 between the monitor target clock n1 and the delayed synchronous signal n3. The phase difference signals n11 and n12 are connected to the NOR latch circuit which is comprised of the NOR gates 15 and 16 and outputs the output signal n14 according to the phase difference signals.

The first FF 12 latches the output signal n14 of the latch circuit 100 at the fall timing of the monitor target clock n1 and outputs the signal n15. When the pulse width of the clock signal n1 becomes smaller than the duty monitor time at this time, for example, the output n11 of the AND gate 13 does not output the phase difference, and the AND gate 14 outputs the phase difference n12. Therefore, the output n14 of the latch circuit 100 keeps the "Low" level, and the output n15 of the first FF 12 becomes the "Low" level.

Likewise, the output n24 of the latch circuit 200 latches a phase difference between the monitor target clock n1 and the delayed synchronous signal n3.

When the duty ratio is normal, the NOR gate 23 and the AND gate 24 output phase difference signals n21 and n22 between the monitor target clock n1 and the delayed synchronous signal n3. The phase difference signals n21 and n22 are connected to the NOR latch circuit which is comprised of the NOR gates 25 and 26 and outputs the output signal n24 according to the phase difference signals.

The second FF 22 latches the output signal n24 of the latch circuit 200 at the rise timing of the monitor target clock n1 and outputs the signal n25. When the pulse width of the clock signal n1 becomes greater than the duty monitor time at this time, for example, the output n21 of the NOR gate 23 does not output the phase difference (or outputs a "Low" level), and the AND gate 24 outputs the phase difference n22. Therefore, the latch circuit 200 is normally in a reset state, the output signal n24 keeps the "Low" level, and the output n25 of the second FF 22 becomes the "Low" level. When the output n15 of the first FF 12 or the output n25 of the second FF 22 becomes a "Low" level or is "deteriorated", therefore, the monitor result n20 for the duty ratio becomes a "High" level.

When the duty ratio of the pulse width of the clock signal n1 or the monitor target clock is deteriorated in the direction of becoming smaller than the duty monitor time, the latch circuit 100 detects the event, whereas when the duty ratio is deteriorated in the direction of becoming larger than the duty monitor time, the latch circuit 200 detects the event.

Figure 8:
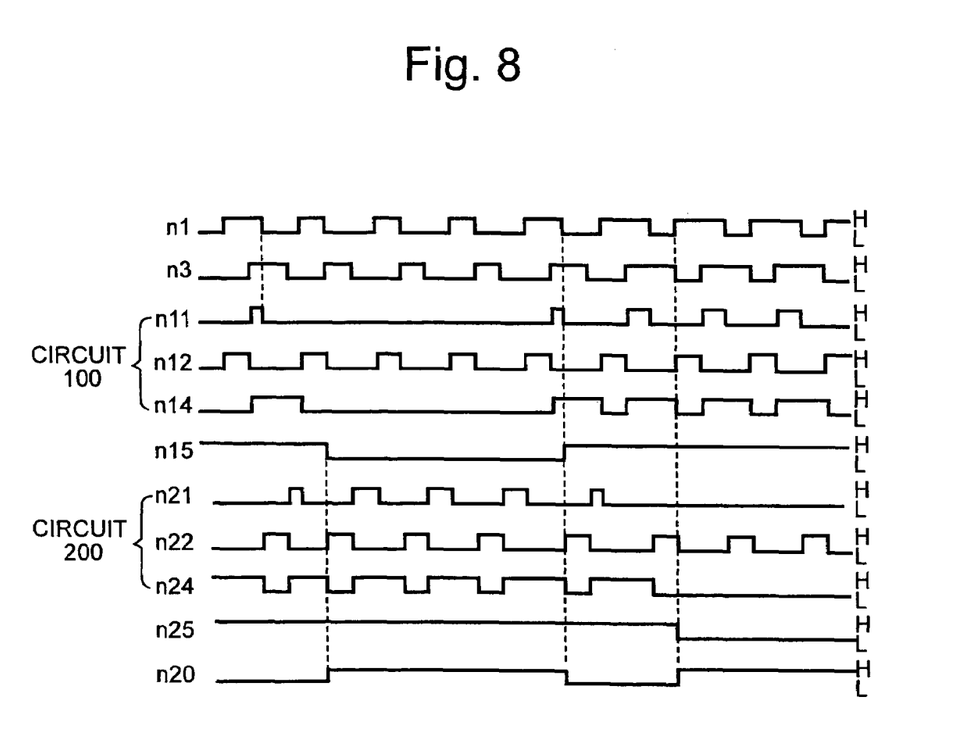
FIG. 8 is a time chart illustrating the operation of the circuit in FIG. 7.

In the circuit of the embodiment, when the monitor result n20 for the duty ratio is a "Low" level, the duty ratio is "normal", whereas when the monitor result n20 is a "High" level, the duty ratio is "deteriorated". FIG. 8 is a time chart illustrating the operation of the circuit in FIG. 7.

When the reset signal n2 has a "High" level, the output signal n15 of the first FF 12 and the output signal n25 of the second FF 22 are reset to a "Low" level asynchronously and the monitor result n20 for the duty ratio becomes a "High" level to be initialized.

As described above, the circuit of the embodiment can detect not only when the duty ratio of the pulse width of the clock signal n1 or the monitor target clock varies small but also when the duty ratio varies considerably. This makes it possible to monitor if the duty ratio lies within an allowable variation range, thus ensuring highly-accurate pulse duty monitoring.

Third Embodiment

Figure 9:
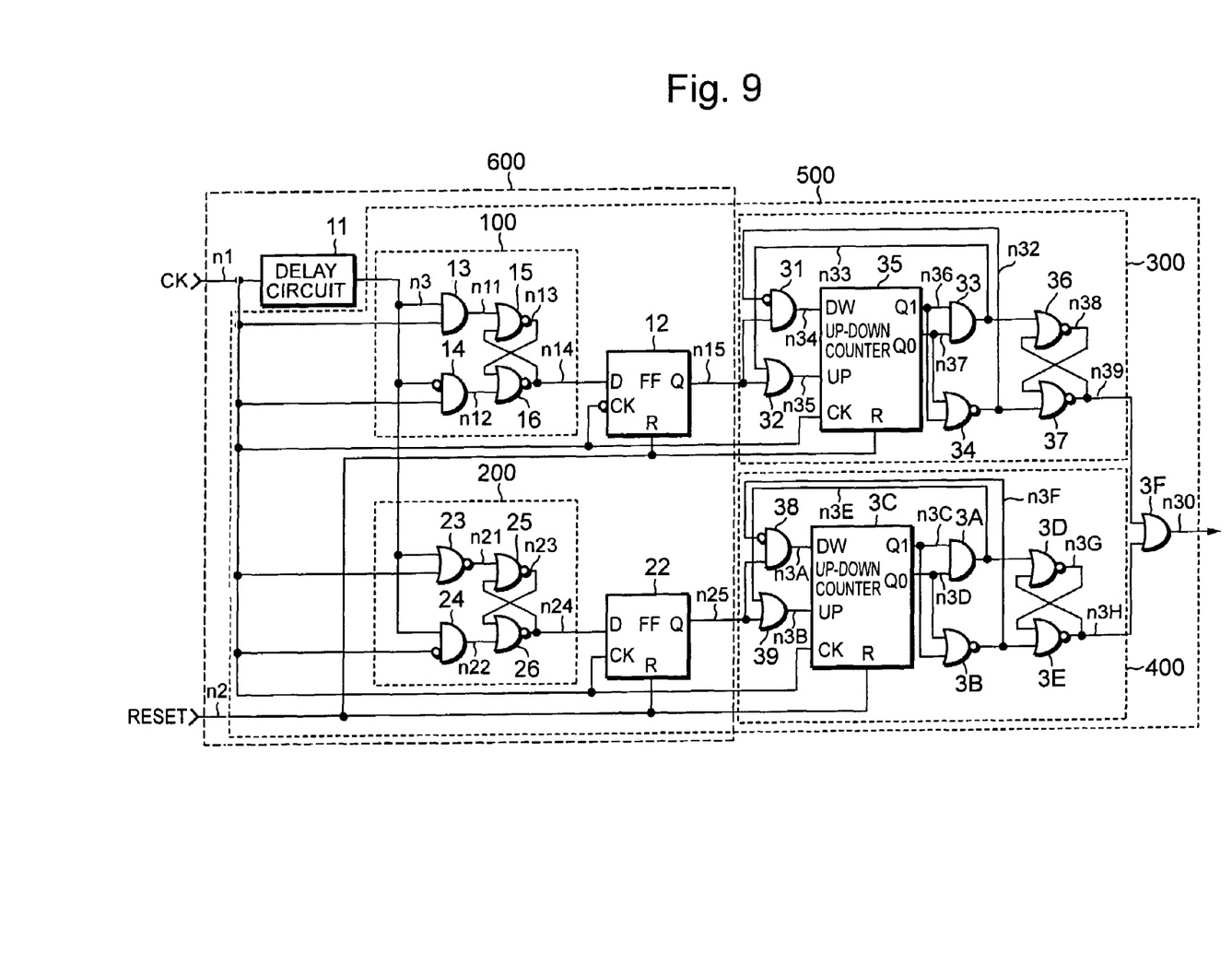
FIG. 9 is a circuit diagram of a pulse duty deterioration detection circuit according to a third embodiment of the invention.

FIG. 9 is a circuit diagram of a pulse duty deterioration detection circuit according to the third embodiment of the invention. This detection circuit comprises a circuit 600 in FIG. 7, erroneous-detection prevention circuits 300 and 400 which respectively receive output result signals n15 and n25 from the circuit 600, and an OR gate 3F which outputs the logical product of output results n39 and n3H of the erroneous-detection prevention circuits 300 and 400.

The erroneous-detection prevention circuit 300 comprises an AND gate 31, an OR gate 32, an up-down counter 35, an AND gate 33, a NOR gate 34 and a NOR latch circuit comprised of NOR gates 36 and 37.

The AND gate 31 receives the output n15 of the FF 12 and the inverted signal of an output signal n32 of the NOR gate 34, and outputs a signal n34. The OR gate 32 receives the output n15 of the FF 12 and an output signal n33 of the AND gate 33, and outputs a signal n35. The up-down counter 35 receives the output n34 of the AND gate 31, the output n35 of the OR gate 32, the monitor target clock n1 and the reset signal n2, and outputs count signals n36 and n37 which are input to both the AND gate 33 and the NOR gate 34. The NOR latch circuit comprised of the NOR gates 36 and 37 receives the output signal n32 of the NOR gate 34 and the output signal n33 of the AND gate 33.

The erroneous-detection prevention circuit 400 comprises an AND gate 38, an OR gate 39, an up-down counter 3C, an AND gate 3A, a NOR gate 3B and a NOR latch circuit comprised of NOR gates 3D and 3E. The connection structure of the circuit 400 is similar to that of the erroneous-detection prevention circuit 300.

The OR gate 3F obtains the logical sum of an output n39 of the erroneous-detection prevention circuit 300 and an output n3H of the erroneous-detection prevention circuit 400 and outputs a signal n30. This signal n30 becomes the monitor result for the duty ratio.

As the operation from the output n15 of the circuit 600 to the output n25 thereof is the same as the corresponding operation of the second embodiment, the subsequent circuit operation will be discussed below.

The erroneous-detection prevention circuit 300 is a circuit which prevents erroneous detection of the deterioration of the duty ratio. The up-down counter 35 operates at the rise timing of the monitor target clock n1, counts up when the output signal n35 of the OR gate 32 has a "Low" level and the output signal n34 of the AND gate 31 has a "Low" level, and counts down when the output signal n35 of the OR gate 32 has a "High" level and the output signal n34 of the AND gate 31 has a "High" level. The up-down counter 35 holds the count value when the output signal n34 has a "Low" level and the output signal n35 has a "High" level or when the output signal n34 has a "High" level and the output signal n35 has a "Low" level.

The condition under which the output signal n35 of the OR gate 32 is has a "Low" level and the output signal n34 of the AND gate 31 has a "Low" level is the case where the output n15 of the FF 12 is at a "Low" level and both outputs n36 and n37 of the up-down counter 35 are not at a "High" level, i.e., the case where count-up has not reached the highest value.

The condition under which the output signal n35 of the OR gate 32 is has a "High" level and the output signal n34 of the AND gate 31 has a "High" level is the case where the output n15 of the FF 12 is at a "High" level, i.e., the duty ratio is normal, and both outputs n36 and n37 of the up-down counter 35 are not at a "Low" level, i.e., the case where count value is not the lowest value.

When the up-down counter 35 counts up to the highest value, the signal n33 becomes a "High" level and the signal n32 becomes a "Low" level, so that the output n39 of the NOR gate 37 keeps the "High" level until the count value of the up-down counter 35 becomes the lowest value. When the up-down counter 35 counts down to the lowest value, the output n39 of the NOR gate 37 becomes a "Low" level and keeps the "Low" level until the count value of the up-down counter 35 becomes the highest value again. In case where the deterioration of the duty ratio has occurred plural times consecutively, therefore, the event can be detected as an erroneous operation of the circuit. This prevents erroneous detection.

The operation of the erroneous-detection prevention circuit 400 is similar to the operation of the erroneous-detection prevention circuit 300, and the duty-ratio monitor result n30 can be acquired from the logical sum of the output n39 of the erroneous-detection prevention circuit 300 and the output n3H of the erroneous-detection prevention circuit 400.

Figure 10:
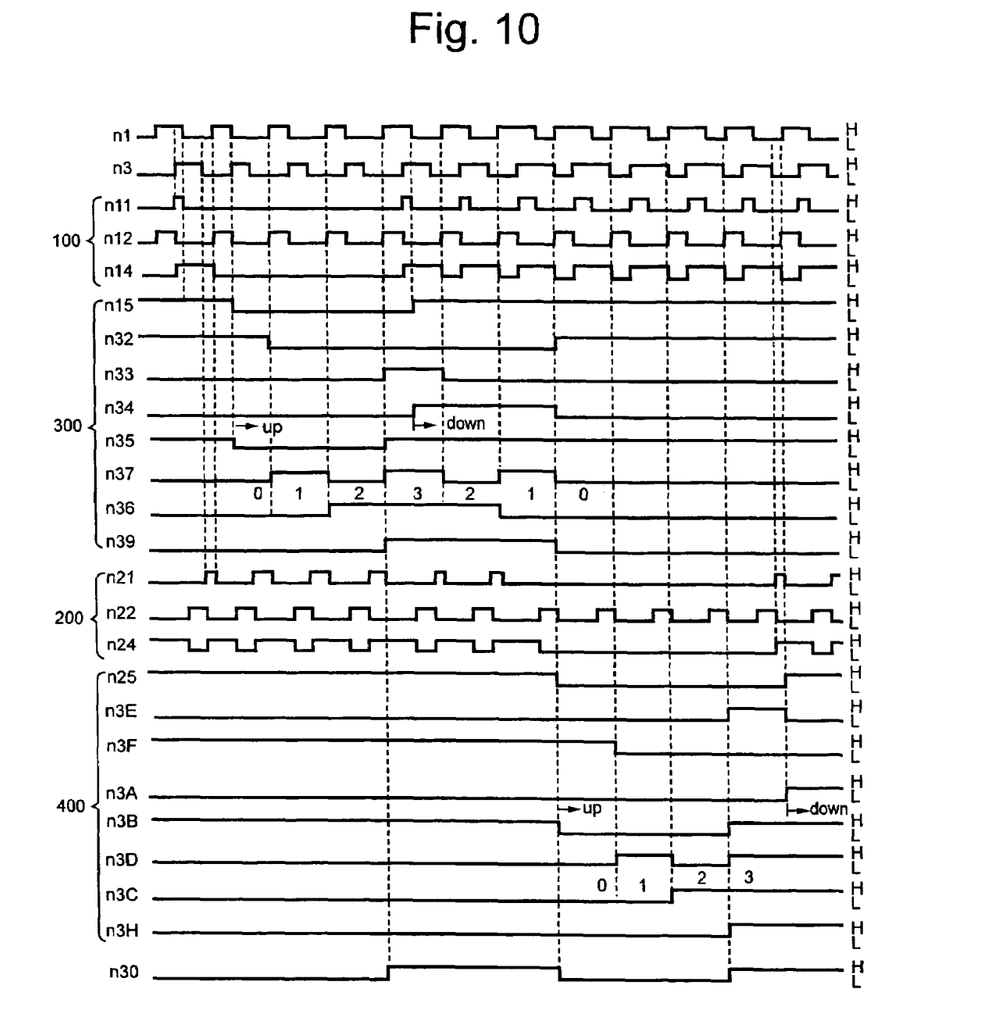
FIG. 10 is a time chart illustrating the operation of the circuit in FIG. 9.

In this embodiment, the duty ratio is "normal" when the duty-ratio monitor result n30 has a "Low" level but the duty ratio is "deteriorated" when the duty-ratio monitor result n30 has a "High" level. FIG. 10 is a time chart illustrating the operation of the circuit in FIG. 9.

When the reset signal n2 has a "High" level, the output signals of the FFs 12 and 22 and the up-down counters 35 and 3C are reset to "Low" levels and initialized and the duty-ratio monitor result n30 becomes a "Low" level. While the up-down counter used in preventing erroneous detection makes four counting actions in this embodiment, it is possible to increase the number of counting actions. It is also possible to increase the number of counting actions, reset the counter every time deterioration is detected and detect the continuous deterioration of the duty ratio.

As described above, with the provision of the erroneous-detection prevention circuits, the embodiment has an advantage of realizing a detection circuit with a high monitoring precision without erroneously detecting the pulse duty ratio to be monitored, in addition to advantages similar to those of the second embodiment.

Fourth Embodiment

Figure 11:
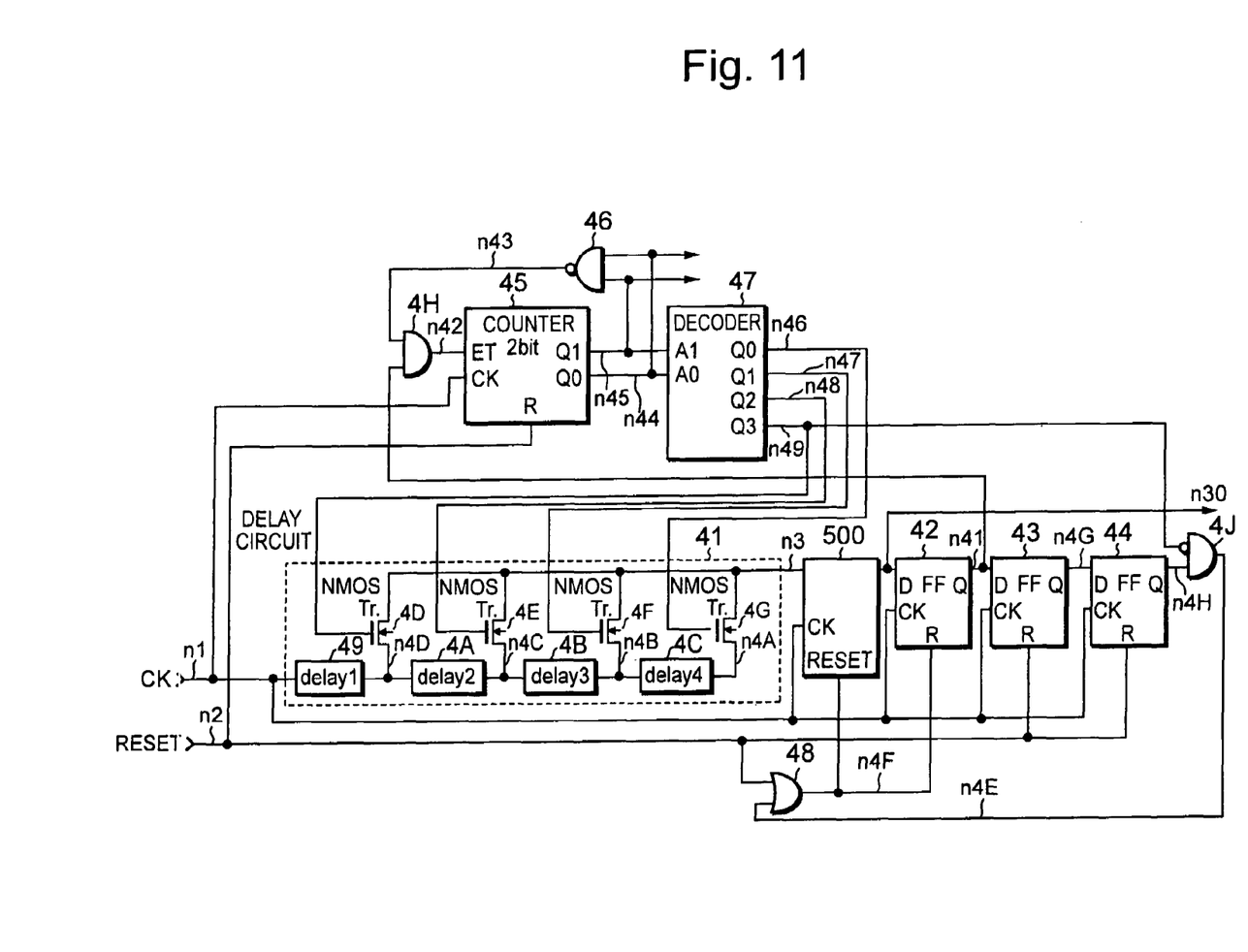
FIG. 11 is a circuit diagram of a pulse duty deterioration detection circuit according to a fourth embodiment of the invention.

FIG. 11 is a circuit diagram of a pulse duty deterioration detection circuit according to the fourth embodiment of the invention. The detection circuit comprises a delay circuit 41 which receives a monitor target clock n1 and output signals n46 to n49 of a decoder 47, a circuit 500 which is similar to the circuit 500 in the third embodiment and receives an output n3 of the delay circuit 41, FFs 42 to 44 connected in series to the output of the circuit 500, an AND gate 4H whose one input is an output 41 of the FF 42 and other input is the output signal, n43, of a NAND gate 46 connected to outputs n44 and n45 of a counter 45, the counter 45 which receives an output n42 of the AND gate 4H, a monitor target clock n1 and a reset signal n2, the decoder 47 which receives the outputs n44 and n45 of the counter 45, an AND gate 4J which receives an output n4H of the FF 44 as one input and the inverted signal of an output n49 of the decoder 47 as the other input, and an OR gate 48 which receives an output n4E of the AND gate 4J as one input and the reset signal n2 as the other input.

The delay circuit 41 has delay circuits 49 to 4C connected in series to one another. A connection node n4D between the delay circuit 49 and the delay circuit 4A is connected to the drain of an NMOS transistor 4D. Likewise, a connection node n4C between the delay circuit 4A the delay circuit 4B is connected to the drain of an NMOS transistor 4E, a connection node n4B between the delay circuit 4B the delay circuit 4C is connected to the drain of an NMOS transistor 4F, and an output node n4A of the delay circuit 4C is connected to the drain of an NMOS transistor 4G. The sources of the NMOS transistors 4D to 4G become the output n3 of the delay circuit 41.

The output signal n46 of the decoder 47 is connected to the gate of the NMOS transistor 4G. Likewise, the output signal n47 is connected to the gate of the NMOS transistor 4F, the output signal n48 is connected to the gate of the NMOS transistor 4E and the output signal n49 is connected to the gate of the NMOS transistor 4D.

The reset signal n2 is connected to the asynchronous reset terminals of the FFs 43 and 44 and the counter 45. A logical sum output n4F of the reset signal n2 and the output n4E of the AND gate 4J is connected to the asynchronous reset terminals of the circuit 500 and the FF 42.

The delay circuit 41 selects delay values of the delay circuits 49 to 4C for the monitor target clock n1, delays the clock n1 by the time needed for duty monitoring and outputs the signal n3 that is delayed synchronously with the monitor target clock n1.

In the initial state where the reset signal n2 has a "High" level, the output signals n45 and n44 of the counter 45 are at "Low" levels, the output n46 of the decoder 47 becomes a "High" level and the outputs n47 to n49 become "Low" levels. In the delay circuit 41, the NMOS transistor 4G is selected with the other NMOS transistors 4D to 4F unselected, and the total of the delay values of the delay circuits 49 to 4C is selected as an initial value. The delay values of the delay circuits 4A to 4C are all identical and are about 2 ns, and the delay value of the delay circuit 49 is set to the minimum allowable value for the duty ratio of the pulse width of the monitor target clock.

While the circuit 500 receives the synchronously delayed signal n3, the operation of the circuit 500 is the same as that of the third embodiment. Therefore, the duty ratio is "normal" if the duty-ratio monitor result n30 is at a "Low" level, but the duty ratio is "deteriorated" if the monitor result n30 is at a "High" level. The monitor result n30 causes a latch signal n41 of the FF 42 to be output at the rise timing of the monitor target clock n1.

The counter 45 counts up at the rise timing of the monitor target clock n1 when the output n42 of the AND gate 4H has a "High" level and does not count up when the output n42 has a "Low" level. The condition under which the output signal n42 of the AND gate 4H becomes a "High" level is the case where the duty-ratio monitor result n30 becomes a "High" level, i.e., the duty ratio is "deteriorated", and count-up has not reached to the highest value. The condition under which the output signal n42 of the AND gate 4H becomes a "Low" level is the case where the duty-ratio monitor result n30 becomes a "Low" level, i.e., the duty ratio is "normal" or both outputs n44 and n45 of the counter 45 have not been counted up to the highest value.

In case where the duty-ratio monitor result n30 has a "High" level, therefore, the counter 45 counts up by one at the rising of the monitor target clock n1, and keeps holding the highest value until the reset signal n2 becomes a "High" level, once the output of the counter 45 is counted up to the highest value. The outputs n44 and n45 of the counter 45 are input to input terminals A0 and A1 of the decoder 47.

When the input terminals A0 and A1 are at "Low" levels, the output n46 of the decoder 47 becomes a "High" level and the outputs n47 to n49 become "Low" levels. Likewise, when the count value of the counter 45 is "1", the output n47 becomes a "High" level while the outputs 46, n48 and n49 become "Low" levels. Depending on the count value of the counter 45, the outputs n47 to n49 become "High" levels in order and the decoder 47 stops when the output n49 becomes a "High" level.

As the outputs n46 to n49 of the decoder 47 are connected to the gates of the respective NMOS transistors of the delay circuit 41, the NMOS transistors are selected in the order of 4F, 4E, and then 4D, thereby making it possible to change the delay value of the monitor target clock (time to monitor a change in duty ratio).

When a "High" level is input to the reset terminals of the circuit 500, the FFs 42 to 44 and the counter 45, the outputs are asynchronously set to "Low" levels. Based on the duty-ratio monitor result n30, the circuit 500 and the FF 42 are asynchronously reset by the FFs 42 to 44, the AND gate 4J and the OR gate 48 after three clocks of the monitor target clock n1. The circuit 500 and the FF 42 are reset after three clocks of the monitor target clock n1 have been counted since the detection that the duty-ratio monitor result n30 has become a "High" level or the detection of "deterioration". During the three clocks where the circuit 500 and the FF 42 are reset, a new delay value is selected by the decoder 47 and detection of the deterioration of the duty starts.

When the "deterioration" of the duty ratio is detected based on the duty-ratio monitor result n30, the detection circuit according to the embodiment automatically changes the delay value that is acquired by synchronously delaying the monitor target clock n1. This can absorb a variation in delay value which would occur due to the fabrication, environment or the like.

Figure 12:
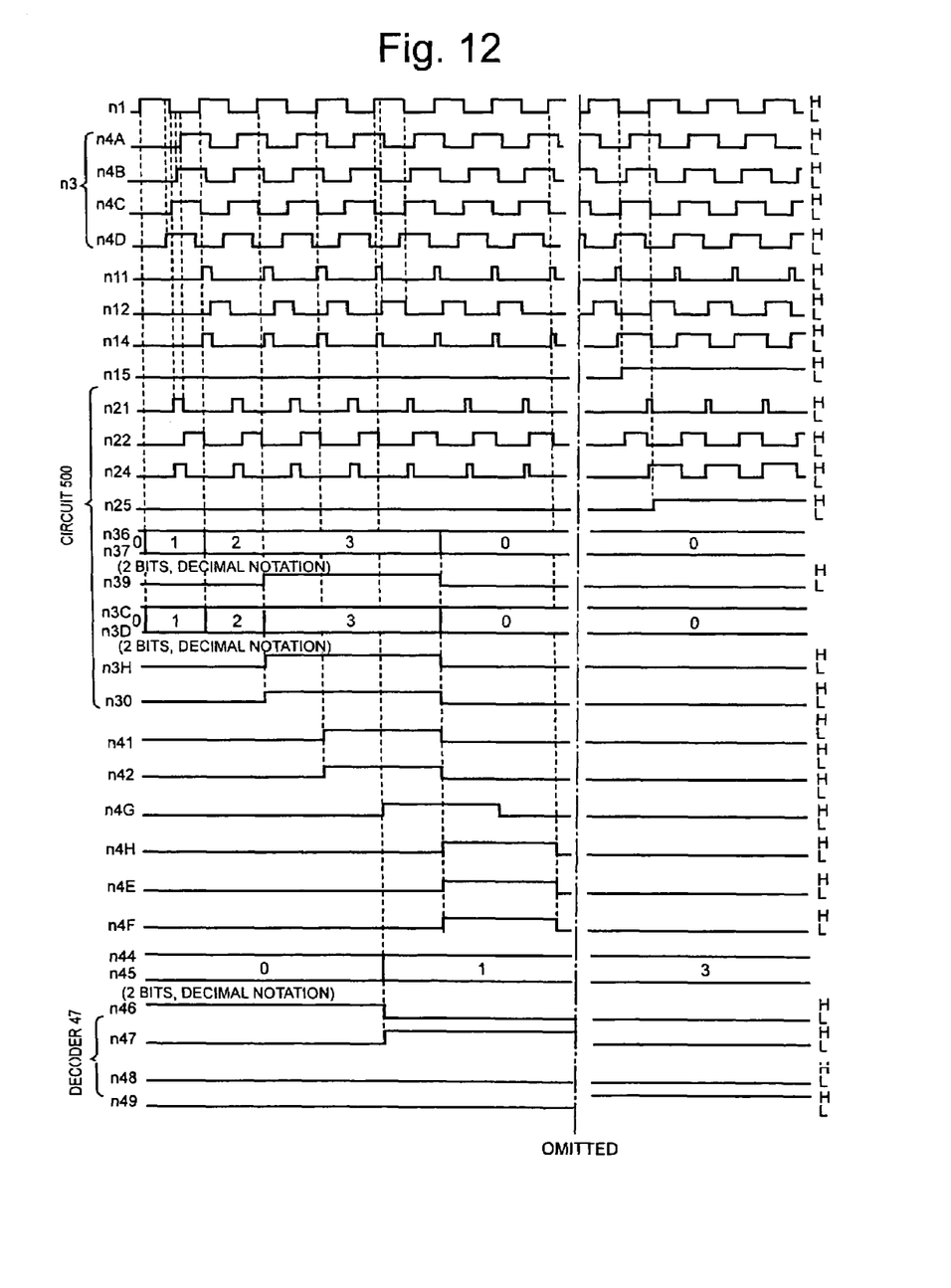
FIG. 12 is a time chart illustrating the operation of the circuit in FIG. 11.

FIG. 12 is a time chart illustrating the operation of the circuit in FIG. 11.

Although there are four variable delay values in the embodiment, the variable value may be set arbitrarily. The initial delay value may be set to the delay value of the delay value delay circuit 4A and an up-down counter may be selected as the counter 45 to increase or decrease the variable value of the delay value.

As described above, the embodiment has advantages similar to those of the third embodiment, and has an additional advantage of realizing a detection circuit which detects pulse duty deterioration with a high accuracy without erroneously detecting the pulse duty to be monitored as the monitor value of the clock to be monitored can automatically be changed and a variation in delay value which would occur due to the fabrication, environment or the like can be absorbed.

In short, as the pulse duty deterioration detection circuit according to the invention can detect the pulse duty with a high monitoring precision, the detection circuit can be adapted to designing a clock generation circuit of an LSI having multifarious functions, e.g., a PLL circuit.

What is claimed is:

1. A pulse duty detection circuit for a to-be-monitored clock, comprising:

a delay circuit comprised of a gate circuit which generates a delayed synchronous to-be-monitored clock by delaying said to-be-monitored clock by a predetermined time;

a latch circuit which detects based on said to-be-monitored clock and said delayed synchronous to-be-monitored clock that a value of a decrease in a pulse width to be determined by a pulse duty of said to-be-monitored clock becomes smaller than said predetermined time; and a flip-flop circuit which samples an output signal of said latch circuit based on said to-be-monitored clock.

2. A pulse duty detection circuit for a to-be-monitored clock, comprising:

a delay circuit comprised of a gate circuit which generates a delayed synchronous to-be-monitored clock by delaying said to-be-monitored clock by a predetermined time;

a first latch circuit which detects based on said to-be-monitored clock and said delayed synchronous to-be-monitored clock that a value of a decrease in a pulse width to be determined by a pulse duty of said to-be-monitored clock becomes smaller than said predetermined time;

a second latch circuit which detects based on said to-be-monitored clock and said delayed synchronous to-be-monitored clock that a value of an increase in said pulse width to be determined by said pulse duty of said to-be-monitored clock becomes greater than said predetermined time;

a first flip-flop circuit which samples an output signal of said first latch circuit based on said to-be-monitored clock;

a second flip-flop circuit which samples an output signal of said second latch circuit based on said to-be-monitored clock; and a circuit which detects based on output signals of said first and second flip-flop circuits that said pulse width of said to-be-monitored clock lies within a predetermined duty range.

3. The pulse duty detection circuit according to claim 2, further comprising:

a first detection circuit, provided on an output side of said first flip-flop circuit, for outputting a significance signal when it is detected that said pulse duty consecutively drops plural times in a direction of reducing said pulse duty;

a second detection circuit, provided on an output side of said second flip-flop circuit, for outputting a significance signal when it is detected that said pulse duty consecutively drops plural times in a direction of increasing said pulse duty; and an output circuit which outputs a signal indicating that said pulse width of said to-be-monitored clock is in a normal range when both of said first and second detection circuits output said significance signals.

4. The pulse duty detection circuit according to claim 3, wherein said delay circuit has a delay element comprised of a plurality of gate circuits connected in series and a switch circuit for selecting a delay time of said delay element, and said pulse duty detection circuit further comprises:

a counter which counts up when said output circuit outputs a signal indicative of duty deterioration; and a decoder circuit which decodes a count value of said counter, whereby a delay time of said to-be-monitored clock is automatically changed by controlling said switch circuit for selecting said delay time of said delay element in accordance with an output signal of said decoder circuit.

* * * * *